(12) United States Patent
Chen

(10) Patent No.: US 7,916,498 B2
(45) Date of Patent: Mar. 29, 2011

(54) COMMUNICATION DEVICE

(75) Inventor: Jian-Ping Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/564,706

(22) Filed: Sep. 22, 2009

(65) Prior Publication Data
US 2010/0142171 A1  Jun. 10, 2010

(30) Foreign Application Priority Data
Dec. 5, 2008 (CN) ...................... 2008 2 0303148 U

(51) Int. Cl.
*H05K 7/14* (2006.01)
*H05K 7/18* (2006.01)
(52) U.S. Cl. ......... 361/800; 361/799; 361/816; 361/818
(58) Field of Classification Search .................. 361/800, 361/816, 818, 679.01, 724–726, 748, 784, 361/796, 799; 174/32, 350, 377, 387; 439/55, 439/78–79, 607.01, 607.2, 607.21, 526–527, 540.1, 540.5; 385/53, 88, 92
See application file for complete search history.

(56) References Cited

U.S. PATENT DOCUMENTS

| | | | |
|---|---|---|---|
| 6,558,191 B2 * | 5/2003 | Bright et al. | 439/541.5 |
| 6,778,399 B2 * | 8/2004 | Medina et al. | 361/729 |
| 6,867,969 B2 | 3/2005 | Huang | |
| 7,160,138 B2 * | 1/2007 | Ishigami et al. | 439/371 |
| 7,508,683 B1 * | 3/2009 | Jochym et al. | 361/818 |

* cited by examiner

*Primary Examiner* — Hung S Bui
(74) *Attorney, Agent, or Firm* — Raymond J. Chew

(57) ABSTRACT

A communication device includes a first printed circuit board (PCB), a second PCB disposed parallel to the first PCB, a first shielding cage and a second shielding cage. The first and second shielding cages are fixed to the first and second PCBs and define at lease one first and second receiving space to receive at least one transceiver modules, respectively. The first and second shielding cages include at least one first and second retaining tabs, respectively. Each of the transceiver modules received in the first and second shielding cages includes a release mechanism configured with a release portion and a trigger. The release portions can match one corresponding first and second retaining tabs to release the corresponding transceiver module. The triggers are disposed on one side of the transceiver modules close to the first and the second PCBs.

4 Claims, 5 Drawing Sheets

COMMUNICATION DEVICE

BACKGROUND

1. Technical Field

The present disclosure relates to electromagnetic shielding, and in particular to a communication device adapted to receive two stacked rows of transceiver modules therein.

2. Description of Related Art

A transceiver module provides bi-directional transmission of data between an electrical interface and an optical data link, and is normally singly received in a cage that provides shielding against electromagnetic interference (EMI). Generally, a communication device requires a plurality of transceiver modules, thus, a plurality of cages are needed in the communication device to accommodate the modules. Each of the plurality of cages occupies enough space to easily insert or remove the transceiver module, increasing volume of the communication device.

Therefore, a need exists in the industry to overcome the described limitations.

DETAILED DESCRIPTION

Figure 1:
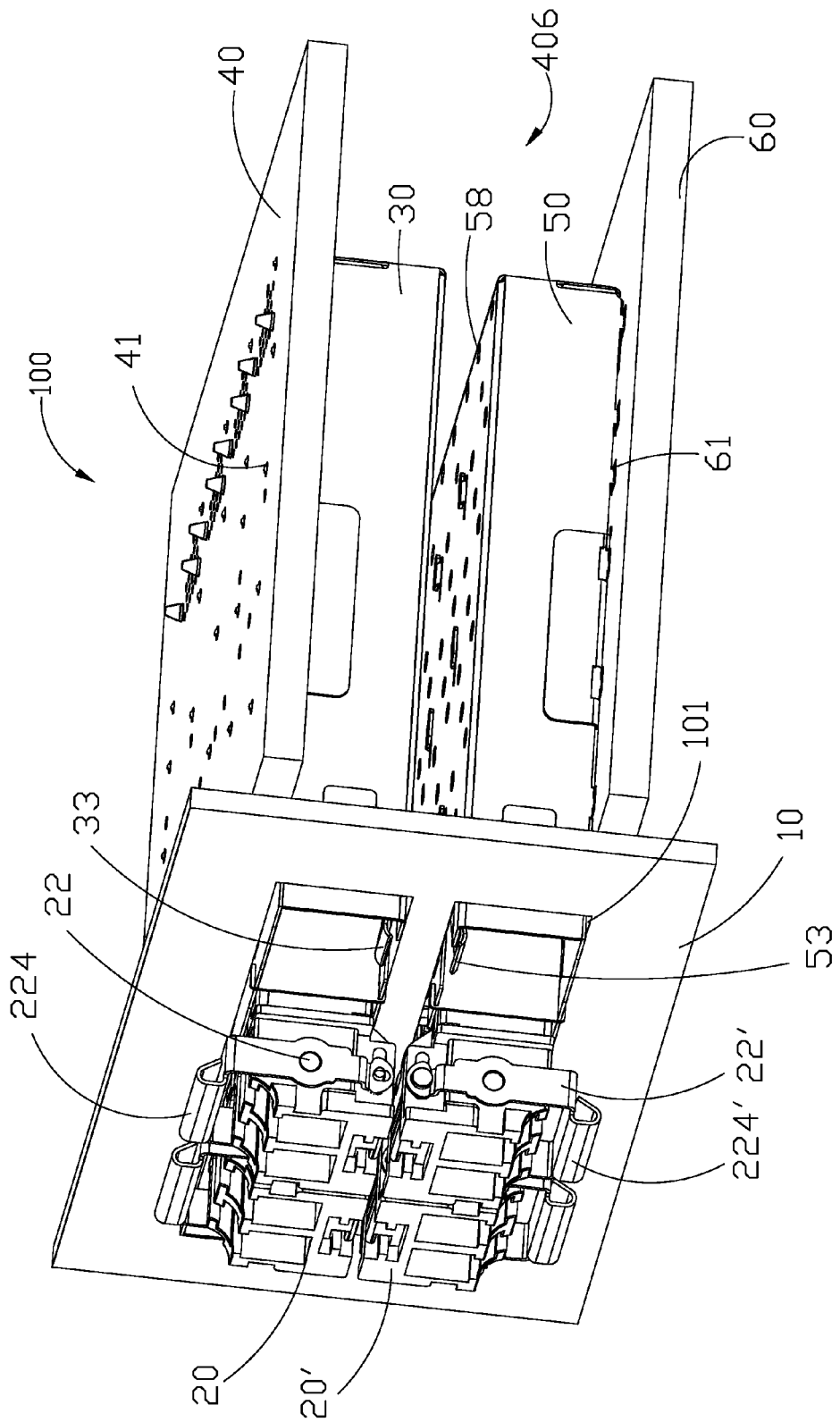
FIG. 1 is a perspective view of a communication device in accordance with the disclosure.

Referring to FIG. 1, a communication device 100 according to the present disclosure is used to receive a plurality of transceiver modules 20 and provides shielding against electromagnetic interference (EMI). The communication device 100 includes a panel 10 and at least two printed circuit boards (PCB), such as a first PCB 40 and a second PCB 60. The panel 10 defines at least two apertures 101 therein corresponding to the at least two PCBs. The first and second PCBs 40, 60 are perpendicular to the panel 10, and collectively define a space 406 between them. A first shielding cage 30 and a second shielding cage 50 are accommodated in the space 406, and are fixed to the first and second PCBs 40, 60, respectively. In one embodiment, the first and second shielding cages 30, 50 are mounted into two apertures 101 of the panel 10, respectively.

Figure 2:
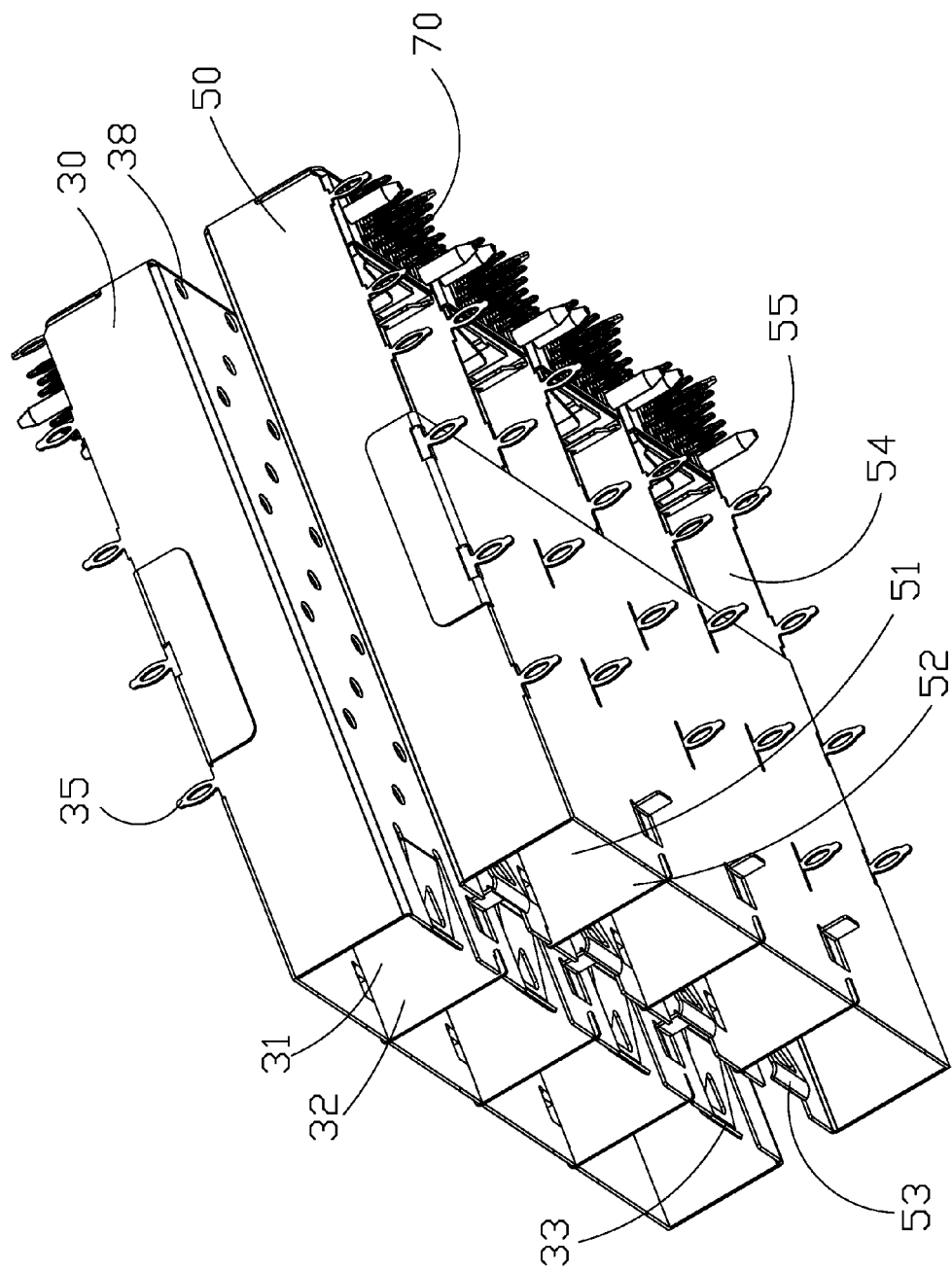
FIG. 2 is a perspective view of a first shielding cage and a second shielding cage of the communication device of FIG. 1, stacked on each other.
Figure 3:
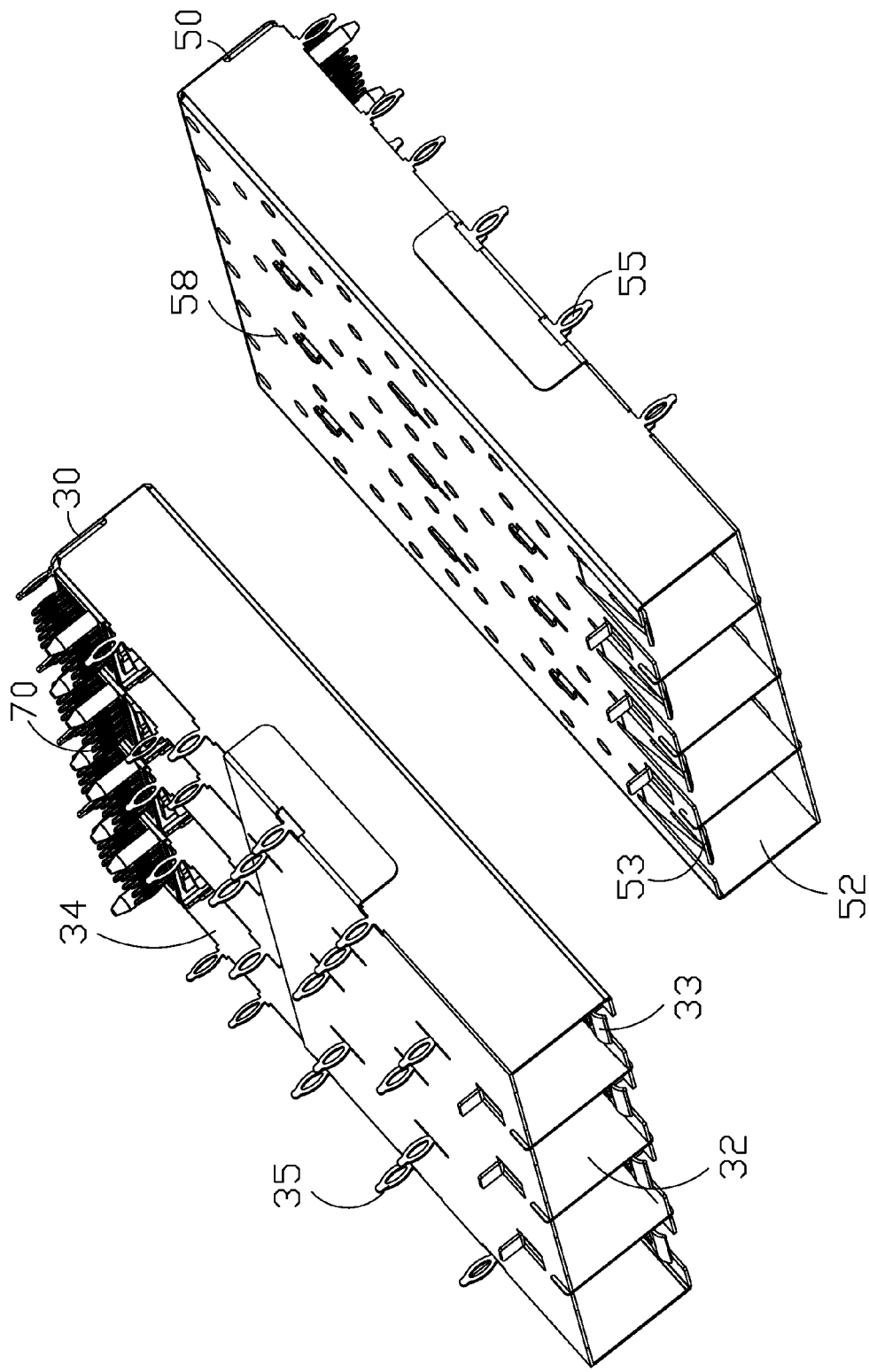
FIG. 3 is an exploded perspective view of FIG. 2, viewed from another aspect.

Referring to FIG. 2 and FIG. 3, the first shielding cage 30 defines at least one first receiving space 31 therein with at least one front opening 32 and at least one rear opening 34. At least one transceiver module 20 is installed in the at least one first receiving space 31 through the front opening 32. At least one connector 70 is installed on the first PCB 40 and electrically connects to the transceiver module 20 through the rear opening 34 after assembly. The first shielding cage 30 includes at least one first retaining tab 33 extending inwardly into the front opening 32 respectively and at least one first mounting pin 35. The first mounting pin 35 extends from one surface of the first shielding cage 30 corresponding to the first PCB 40. The first mounting pin 35 is received in at least one first mounting hole 41 of the first PCB 40. The first retaining tab 33 is located on another surface of the first shielding cage 30 and faces the second shielding cage 50 after assembly. The first shielding cage 30 is installed on the first PCB 40 via the first mounting pin 35 matching the mounting hole 41 of the first PCB 40.

Similar to the first shielding cage 30, the second shielding cage 50 defines at least one first receiving space 51 therein with at least one front opening 52 and at least one rear opening 54. At least one transceiver module 20' is received in the first receiving space 51 through the front opening 52. At least one connector 70 is installed on the second PCB 60 and electrically connected to the transceiver module 20 through the rear opening 54 after assembly. The second shielding cage 50 includes at least one second retaining tab 53 extending inwardly into the front opening 52 individually and at least one second mounting pin 55. The second mounting pin 55 extends from one surface of the second shielding cage 50 to be received in at least one second mounting hole 61 of the second PCB 60. The second retaining tab 53 is located on another surface of the second shielding cage 50 and faces the first retaining tab 33 of the first shielding cage 30 after assembly. The second shielding cage 50 is installed on the second PCB 60 via the second mounting pin 55 matching the second mounting hole 61 of the second PCB 60.

Figure 4:
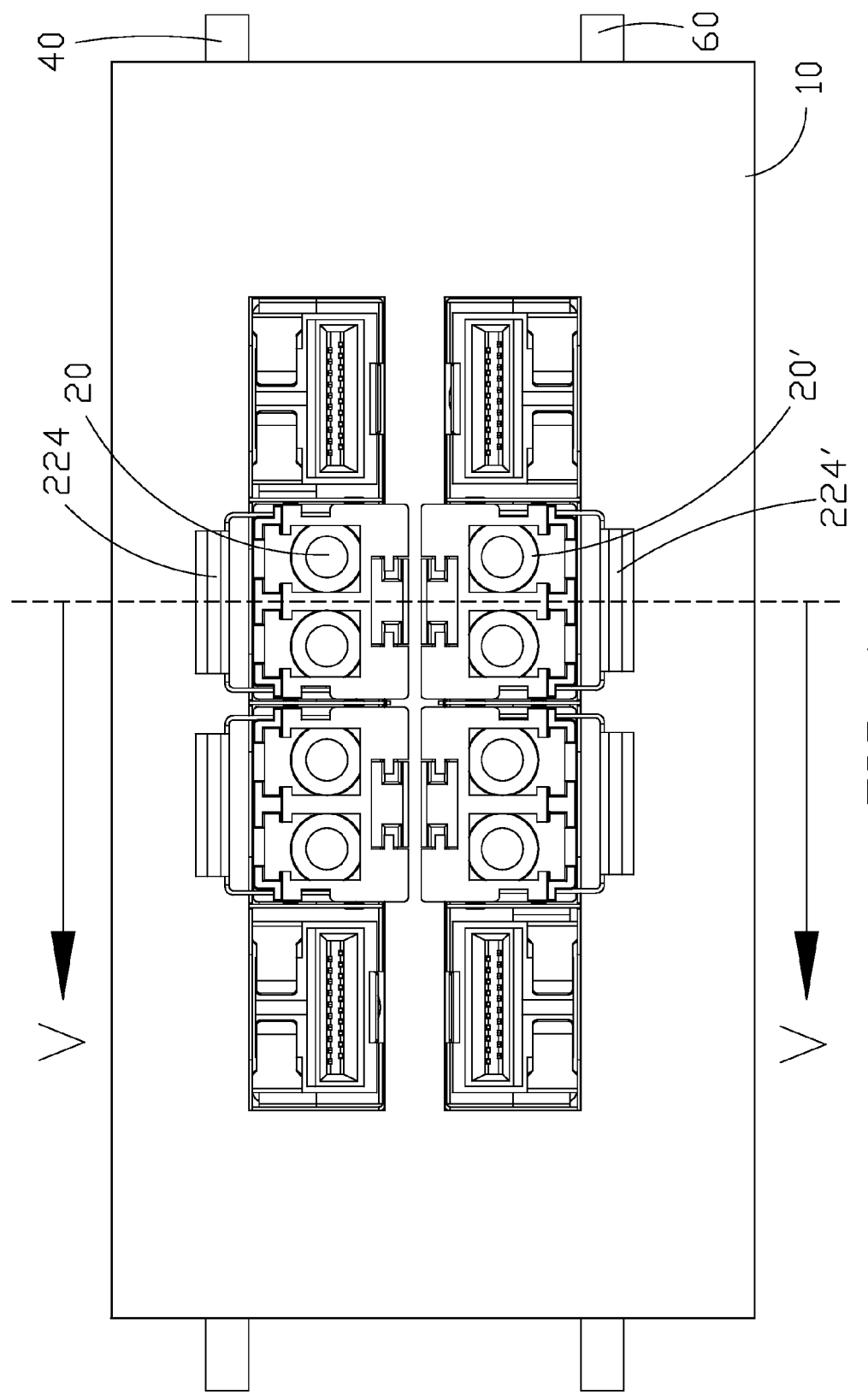
FIG. 4 is front view of the communication device of FIG. 1.
Figure 5:
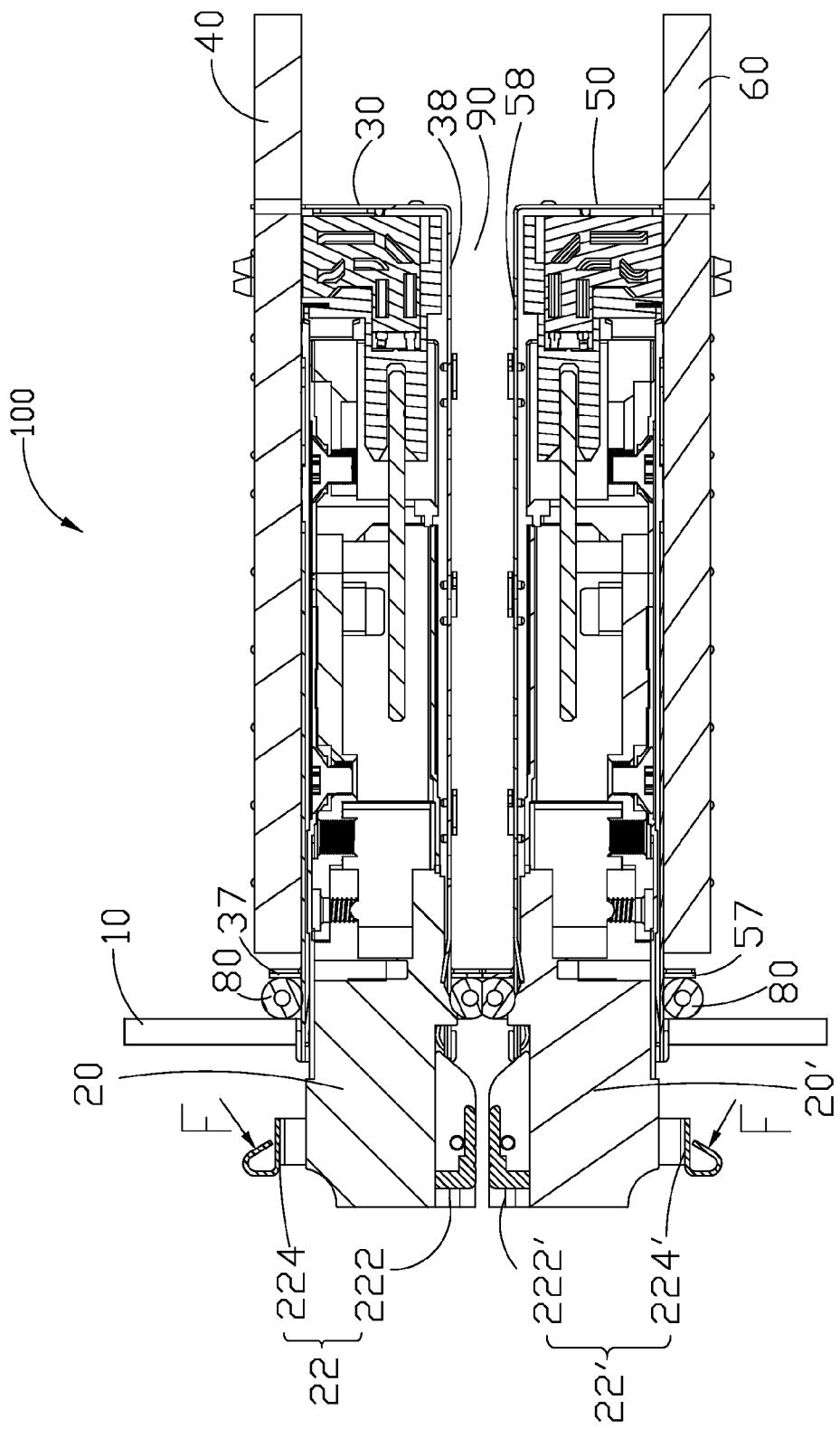
FIG. 5 is a cross-section along line V-V of FIG. 4.

Referring to FIG. 4-FIG. 5, the first PCB 40 is positioned parallel to the second PCB 60 with the first shielding cage 30 adjacent to the second shielding cage 50. Each of the transceiver modules 20(20') respectively received in the first and second shielding cages 30, 50 includes a release mechanism 22(22') configured with a release portion 222(222') and a trigger 224(224'). When the trigger 224 is operated, the release portions 222 of the transceiver modules 20 push the first retaining tab 33 to release the transceiver modules 20 from the first cage 30. The triggers 224 and 224' are disposed on sides of the transceiver modules 20 and 20' close to the first and the second PCBs 40, 60, so that enough space is reserved around the triggers 224 and 224' to manual activation of the triggers 224 and/or 224'. Therefore, it is convenient to apply an external force F on the triggers 224(224') to release the corresponding transceiver modules 20(20') from communication device 100. Additionally, the first shielding cage 30 is close to the second shielding cage 50, and the first shielding cage 30 and the second shielding cage 50 define a gap 90 therebetween. The first and second shielding cages 30, 50 define a plurality of vent holes 38, 58 communicating with the gap 90 to improve ventilation and cooling performance.

Each of the first and second shielding cages 30, 50 includes a baffle 37, 57 disposed around the front openings 32, 52. Two electrically conductive rubber rings 80 surrounding the first and second shielding cages 30, 50, respectively, are disposed between the baffles 37, 57 and the panel 10 to ground the first and second shielding cages 30, 50 to the panel 10, thereby improving EMI shielding effectiveness of the communication device.

In use, the communication device receives two stacked rows of transceiver modules 20(20') therein. Activation of the triggers 224(224') of the release mechanisms 22(22') of the transceiver modules 20(20') manually to release the transceiver modules 20(20') is readily enabled, due to ample clear space therearound.

While exemplary embodiments have been described, it should be understood that they have been presented by way of example only and not by way of limitation. The breadth and scope of the disclosure should not be limited by the described exemplary embodiments, but only in accordance with the following claims and their equivalents.

What is claimed is:

1. A communication device, comprising:
   a first PCB;

a second PCB positioned parallel to the first PCB;

a first shielding cage, fixed to the first PCB, and defining at least one first receiving space to receive at least one transceiver module therein, the first shielding cage comprising at least one first retaining tab extending inwardly into a front opening of the at least one first receiving space; and a second shielding cage, fixed to the second PCB, and neighboring the first shielding cage, the second shielding cage defining at least one second receiving space to receive at least one transceiver module therein, and comprising at least one second retaining tab extending inwardly into a front opening of the at least one second receiving space;

wherein the first and second PCBs collectively define a space therebetween, and the first shielding cage and the second shielding cage are accommodated in the space;

wherein each of the transceiver modules received in the first and second shielding cages comprises a release mechanism configured with a release portion and a trigger, wherein the release portion is structured to collaborate with one of the first and second retaining tabs to release the corresponding transceiver module from the first or second shielding cage, the triggers disposed on corresponding sides of the transceiver modules close to the first and the second PCBs.

2. The communication device as claimed in claim 1, further comprising a panel configured with two apertures, in which the first and second shielding cages are mounted.

3. The communication device as claimed in claim 2, wherein each of the first and second shielding cages comprises a baffle disposed around the front openings thereof, and two electrically conductive rubber rings surrounding the first and second shielding cages respectively are disposed between the baffles and the panel to ground the first and second shielding cages to the panel.

4. The communication device as claimed in claim 1, wherein the first shielding cage and the second shielding cage define a gap therebetween.

\* \* \* \* \*